(12) United States Patent
Plat et al.

(10) Patent No.: US 7,427,457 B1
(45) Date of Patent: *Sep. 23, 2008

(54) METHODS FOR DESIGNING GRATING STRUCTURES FOR USE IN SITU SCATTEROMETRY TO DETECT PHOTORESIST DEFECTS

(75) Inventors: Marina V. Plat, San Jose, CA (US); Calvin T. Gabriel, Cupertino, CA (US); Christopher F. Lyons, Fremont, CA (US); Anna M. Minvielle, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 800 days.

This patent is subject to a terminal disclaimer.

(21) Appl. No.: 10/934,277

(22) Filed: Sep. 3, 2004

(51) Int. Cl.
*G03F 9/00* (2006.01)

(52) U.S. Cl. .............................. 430/5; 430/30; 382/144; 382/145

(58) Field of Classification Search ..................... 430/5, 430/30; 382/144, 145
See application file for complete search history.

(56) References Cited

U.S. PATENT DOCUMENTS

| | | | |
|---|---|---|---|
| 5,739,909 A | 4/1998 | Blayo et al. | |
| 6,383,824 B1 | 5/2002 | Lensing | |
| 6,433,878 B1 | 8/2002 | Niu et al. | |
| 6,451,621 B1 | 9/2002 | Rangarajan et al. | |
| 6,537,833 B1 | 3/2003 | Lensing | |
| 6,545,753 B2 | 4/2003 | Subramanian et al. | |
| 6,558,965 B1 | 5/2003 | Singh et al. | |
| 6,562,635 B1 | 5/2003 | Lensing et al. | |
| 6,579,733 B1 | 6/2003 | Rangarajan et al. | |
| 6,589,804 B1 | 7/2003 | Halliyal et al. | |
| 6,594,024 B1 | 7/2003 | Singh et al. | |
| 6,602,723 B1 | 8/2003 | Markle | |
| 6,602,727 B1 | 8/2003 | Rangarajan | |
| 6,614,540 B1 | 9/2003 | Stirton | |
| 6,630,361 B1 | 10/2003 | Singh et al. | |
| 6,639,663 B1 | 10/2003 | Markle et al. | |
| 6,643,557 B1 | 11/2003 | Miller et al. | |
| 6,650,422 B2 | 11/2003 | Singh et al. | |
| 6,650,423 B1 | 11/2003 | Markle et al. | |
| 6,677,170 B1 | 1/2004 | Markle | |
| 6,704,101 B1 | 3/2004 | Rangarajan et al. | |
| 6,707,562 B1 | 3/2004 | Lensing | |
| 6,716,646 B1 | 4/2004 | Wright et al. | |
| 6,727,995 B1 | 4/2004 | Halliyal et al. | |
| 6,742,168 B1 | 5/2004 | Nariman | |
| 6,771,356 B1 | 8/2004 | Lyons et al. | |
| 6,786,983 B2 | 9/2004 | Szymanowski et al. | |
| 7,052,921 B1 * | 5/2006 | Plat et al. | 438/14 |

OTHER PUBLICATIONS

Andrew H. Shih, Scatterometry-based critical dimension and profile metrology, Sep. 16, 2002.
Andrew H. Shih, High Performance scatterometry for key dimension metrology, Jul. 17, 2002.
Xinhui Niu, Spectral Scatterometry for CD Control, 2003.
John R. (Bob) McNeil, Scatterometry Applied to Microelectronics Processing, 2003.
Xinhui Niu, Nickhil Jakatdar, Junwei Bao, and Costas J. Spanos, Specular Spectroscopic Scatterometry, 2001 IEEE.
K.J. Stanley, Timothy D. Stanley and Jose' Maia, Realizing 300MMM FAB Productivity Improvements Through Integrated Metrology, 2002.
Xinhui Niu, Nickhil Jakatdar, Junwei Bao, Costas J. Spanos and Sanjay Yedur, Specular Spectroscopic Scatterometry in DUV Lithography, 2004.
US 6,549,287, 04/2003, Lensing (withdrawn)

* cited by examiner

*Primary Examiner*—Christopher G Young
(74) *Attorney, Agent, or Firm*—Renner, Otto, Boisselle & Sklar, LLP

(57) ABSTRACT

The present invention discloses a system and method for designing grating structures for use in situ scatterometry during the photolithography process to detect a photoresist defect (e.g., photoresist erosion, pattern collapse or pattern bending). In one embodiment, a grating structure may be designed with a pitch or critical dimensional smaller than the one used for the semiconductor device. The pitch and the critical dimension of the grating structure may be varied. In another embodiment, the present invention provides for a feedback mechanism between the in situ scatterometry process and the photolithography process to provide an early warning of the existence of a photoresist defect. If a defect is detected on the wafer, the wafer may be sent to be re-worked or re-patterned, thereby avoiding scrapping the entire wafer.

27 Claims, 7 Drawing Sheets

METHODS FOR DESIGNING GRATING STRUCTURES FOR USE IN SITU SCATTEROMETRY TO DETECT PHOTORESIST DEFECTS

BACKGROUND OF THE INVENTION

1. Technical Field

The present invention relates generally to the field of semiconductor fabrication. In particular, the present invention discloses a system and method for designing one or more grating structures for use in situ scatterometry to provide early warning of pattern integrity defects during the fabrication process.

2. Description of the Related Art

The semiconductor industry is constantly striving to increase the operating speed of integrated circuit devices, e.g., microprocessors, memory devices, and the like. The semiconductor industry is fueled by developer and consumer demand for computers and electronic devices that operate at increasingly greater speeds. This demand for increased speed has resulted in a continual reduction in the size of semiconductor devices, e.g., transistors. Thus, there is a constant drive to reduce the size of the components of a typical transistor in order to increase the overall speed of the transistor.

An exemplary field effect transistor 10 is shown in FIG. 1. The transistor 10 generally includes the following components: a wafer body 12, a surface of the wafer body 12A, a gate electrode 14, a gate insulator 16, a source 18, a drain 20, and isolation regions 22. The wafer body 12 is typically comprised of appropriately doped Silicon (Si), Gallium Arsenide (GaAs) or Geranium (Ge). By way of example, common dopants for Silicon include Phosphorous (P) and Arsenic (As) as N-type transistors and Boron (B) for P-type transistors. In the process of forming integrated circuit devices, millions of transistors are formed on the surface of the wafer body 12A. The wafer body 12 may be doped with either N-type or P-type dopant materials. The transistor 10 may have a doped polycrystalline silicon (polysilicon) gate electrode 14 formed above a gate insulation layer 16. The source 18 and the drain 20 elements of the transistor 10 may be formed by performing one or more ion implantation processes to introduce dopant atoms into the wafer body 12. Isolation regions 22 may be provided to isolate the transistor 10 electrically from neighboring semiconductor devices, such as other transistors located within the wafer body 12 (not shown).

In addition, although not shown in FIG. 1, a typical integrated circuit device is comprised of a plurality of conductive interconnections, commonly referred to as conductive lines or vias, positioned in multiple layers of insulating material formed above the wafer body 12. These conductive interconnections allow electrical signals to propagate between the transistors formed above the wafer body 12.

Due to the complexity and the microscopic size of these transistors, there are many dimensions that are critical for the fabrication process, e.g., the width of the gate electrode 14, conductive lines, openings in insulating layers to allow subsequent formation of a conductive interconnection, i.e., a conductive line or contact, therein, etc. In general, semiconductor manufacturing operations involve, among other things, the formation of layers of various materials, e.g., polysilicon, metals, insulating materials, etc., and the selective removal of portions of those layers by performing known photolithographic and etching techniques. These processes are repeated until such time as the integrated circuit device is complete.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. Due to the complexity and reduced size of these devices, it is very important that these features be formed as accurately as possible. For example, the width of the gate electrode 14 corresponds approximately to the channel length 24 of the transistor 10 when it is operational. Accordingly, even slight variations in the actual dimension of this feature as fabricated may adversely affect device performance. Thus, there is a great need for a system and method that may be used to accurately, reliably and repeatedly troubleshoot and form features to their desired critical dimension.

Photolithography is a process commonly employed in semiconductor manufacturing. Photolithography generally involves forming a layer of photoresist material (positive or negative) above one or more layers of material, e.g., polysilicon, silicon dioxide, that are desired to be patterned. Thereafter, a pattern that is desired to be formed in the underlying layer or layers of material is initially formed in the layer of photoresist using an appropriate stepper or scanning tool and known photolithographic techniques, i.e., an image on a reticle in the stepper tool is transferred to the layer of photoresist. The layer of photoresist is then developed so as to leave in place a patterned layer of photoresist substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer. The features in the patterned layer of photoresist also have a critical dimension, sometimes referred to as a develop inspect critical dimension (DICD).

In one exemplary embodiment, modern photolithography processes generally involve the steps of: (1) applying a layer of photoresist above a wafer, typically accomplished by a spin-coating process; (2) pre-baking (or soft-baking) the layer of photoresist at a temperature of approximately 90-120 degree Celsius to reduce the level of solvents in the layer of photoresist and to improve the adhesion characteristics of the photoresist; (3) performing an exposure process, wherein a pattern is projected onto the layer of photoresist through a reticle used in a stepper tool to create a latent image in the layer of photoresist; (4) performing a post-exposure bake on the layer of photoresist at a temperature approximately 5-15 degree Celsius higher than the pre-bake process; (5) performing a develop process to turn the latent image in the layer of photoresist into the final resist image; and (6) performing a post-bake process (or hard-bake) at a temperature of approximately 125-160 degree Celsius to remove residual solids, improve adhesion, and to increase the etch resistance of the photoresist.

Due the pervasive trend in the art of IC fabrication to increase the density with which various structures are arranged, there is a corresponding need to increase the resolution capability of photolithography systems. To accomplish this goal, relatively short wavelengths (e.g., less than about 258 nm) have been used for the illumination light source. In conjunction with these relatively short wavelengths, ultra thin resists (UTR) have been used. For example, many applications include the use of photo resist layers that have a thickness of about 0.1 micron or thinner.

Further background for the present invention will now be described with reference to FIGS. 2 and 3. As shown in FIG. 2, a process layer 26 is formed above a wafer body 12 (or other previously-formed process layer) and a layer of photoresist material 28 (positive or negative) is formed above the process layer 26. The process layer 26 is meant to be illustrative of any type of material that may be patterned using known photolithographic and etching techniques. Using known photolithographic techniques, the layer of photoresist material 28 is patterned to define a plurality of photoresist features 28A that are intended to be used as a mask in patterning the underlying process layer 26 as illustrated in FIG. 3. This mask may also be referred to herein as a patterned photoresist mask.

For a variety of reasons, the photolithography process described above may result in imperfect semiconductor fabrication. Common problems associated with semiconductor fabrication are photoresist erosion, photoresist bending and pattern collapse. As semiconductors continue to shrink, the photolithography requirements become much more demanding. A consequence of this is photoresists that are thinner and inherently less resistant to erosion by the etching process. Likewise, photoresist bending and the collapse of photolithographic patterns occur during the etch process when a rinse solution, usually water, is removed from the surface in a spin drying step. As the water is removed, capillary forces, caused by the surface tension of water between densely packed photoresist features, cause the pattern to bend and in some instances to ultimately collapse. In general, capillary forces increase as the separation between photoresist features decreases. Since the minimum distance between lithographic features has been predicted to decrease from 180 nm in 1999 to 100 nm in 2009, the bending and collapse of photoresist features is expected to have a significant impact on the next generation of semiconductors.

Photoresist erosion, photoresist bending and pattern collapse during plasma etch may result in significant defects in the semiconductor and possibly result in the scrapping of the underlying wafer bodies. It is desirable to detect such photoresist problems early in the photolithography process before they require scrapping of the underlying wafer bodies.

The cause of many of the problems mentioned above arises directly from the photolithography process. For example, photolithography processes using 248 nm exposure tools can be used to develop photoresist patterned masks with critical dimensions typically down to 180 nm at best. Advanced exposure tools and photoresist formulas are required to routinely achieve critical dimensions of 150 nm or less. However, logic applications often require smaller gate width dimensions, necessitating further trimming of the developed photoresist before the photoresist pattern is transferred to the underlying film. This process is typically referred to as trim etch (also referred to as plasma etch). As shown in FIG. 4, the resist line 30 on substrate 31 has a width denoted by DICD. The width of resist line 30 is wider than the desired gate to be formed, as illustrated by the dashed line. For example, a typical deep-UV stepper in certain embodiments provides reliable resolution capabilities down to 0.25 µm. To provide for gate width that is less than 0.25 µm, the 0.25 µm wide photoresist line is isotropically etched in a controlled manner in a high-density plasma etching system, to provide etching in horizontal directions $A_1$, $A_2$ along with etching in the vertical direction B, until a narrower final line, having a final critical dimension (FICD), remains.

Since a photoresist line with a relatively large DICD requires a relatively long trim etch time to achieve a given FICD, a significant amount of the photoresist is normally etched away in a vertical direction B, resulting in a substantial weakening and thinning of the photoresist 30. This significant reduction of the vertical dimension or thickness of the photoresist 30 from its untrimmed vertical dimension can promote discontinuity thereof, resulting in the photoresist 30 being incapable of providing effective masking in the fabrication of the gate. As in the case of a relatively small DICD, a photoresist with a small vertical photoresist dimension is required in order to prevent pattern collapse and/or bending caused by the capillary forces (discussed above), due to an undesirably high aspect ratio ("AR"), i.e., height/width ratio, of the partially etched resist structure.

Thus, there is a strong need in the art for a system and method to provide early warning of photoresist pattern integrity during photoresist pattern development thereby preventing or substantially reducing the need to scrap wafer bodies.

SUMMARY OF THE INVENTION

The present invention is directed methods for designing grating structures for use in in situ scatterometry to detect and troubleshoot photoresist defects, such as photoresist erosion, photoresist bending and/or pattern collapse. In one embodiment, the present invention is directed to identifying a photoresist defect to be detected in a semiconductor; characterizing at least one photoresist feature associated with the semiconductor; designing at least one grating structure having at least one photoresist feature based upon a desired aspect ratio of the photoresist feature associated with the semiconductor; and patterning a photoresist mask including the at least one grating structure to be imaged on a layer of photoresist.

In another embodiment, the invention is directed to a method for designing a grating structure for use in situ scatterometry to detect a photoresist defect including identifying a defect to be detected in a semiconductor; characterizing at least one photoresist feature associated with the semiconductor; designing at least one grating structure having at least one photoresist feature smaller than the photoresist feature characterized; and patterning a photoresist mask including at least one grating structure to be imaged on a layer of photoresist.

In yet another embodiment, the invention is directed to a method for designing a grating structure for use in situ scatterometry to detect a photoresist defect including identifying a defect to be detected in a semiconductor; characterizing at least one photoresist feature associated with the semiconductor; designing at least one grating structure having at least one photoresist feature with substantially same dimensions as the photoresist feature characterized; and patterning a photoresist mask including at least one grating structure to be imaged on a layer of photoresist.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
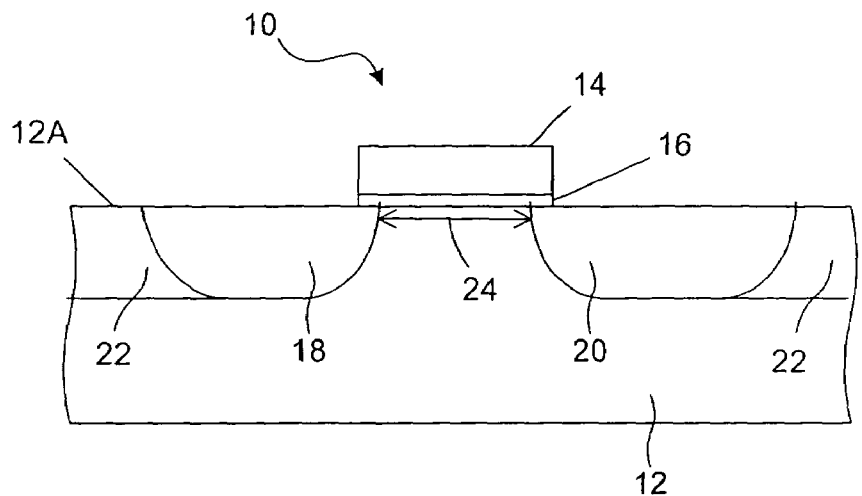
FIG. 1 is a cross-sectional view of an exemplar field effect transistor.
Figure 2:
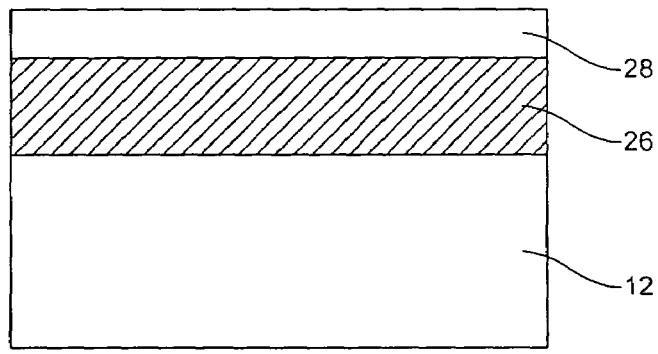
FIG. 2 is a cross-sectional view of a process layer having a layer of photoresist formed thereon.
Figure 3:
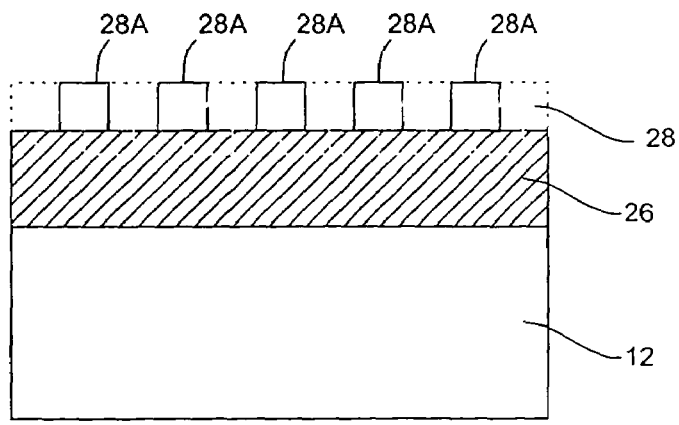
FIG. 3 is a cross-sectional view of a process layer having a layer of developed photoresist formed thereon.

In the detailed description that follows, corresponding components have been given the same reference numerals, regardless of whether they are shown in different embodiments or views of the inventions described herein. To illustrate the various aspects of the inventions in a clear and concise manner, the drawings may not necessarily be to scale and certain features may be shown in somewhat schematic form.

The description herein is presented in the exemplary context of fabricating a wafer having an integrated circuit (IC) formed thereon. Example ICs include general purpose microprocessors and/or logic circuits made from thousands or millions of transistors, a flash memory array or any other dedicated circuitry. However, one skilled in the art will appreciate that the systems and processes described herein can also be applied to the fabrication of any article manufactured using lithography, such as micromachines, disk drive heads, gene chips, micro electro-mechanical systems (MEMS) and so forth.

In general, the present invention is directed to a system and method of designing grating structures for use in situ scatterometry during the photolithography process to detect defects in the fabrication process and present a feedback mechanism to control the photolithography process based upon the scatterometry comparisons. In particular, the present invention may use sub-nominal grating structures during in situ scatterometry to detect pattern integrity and prevent common photolithography problems, such as photoresist erosion, photoresist bending, undercutting, pattern collapse, and the like prior to the main etch of the wafer. If the in situ scatterometry measurements associated with a photoresist thickness of a wafer falls within an acceptable range of photoresist thickness, as determined by a characteristic (or target) trace, the next photolithography operation is performed on the wafer. However, if a pattern integrity defect is detected, the present invention allows for re-working or re-patterning of the wafer prior to the main etch process being performed thereon, thereby avoiding costly wafer scrapping.

As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Figure 5A:
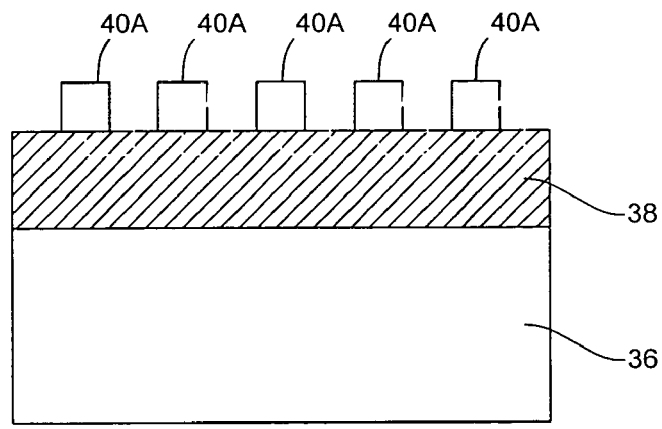
FIG. 5A is a cross-sectional view of an exemplary process layer having a layer of developed photoresist formed thereon.
Figure 5B:
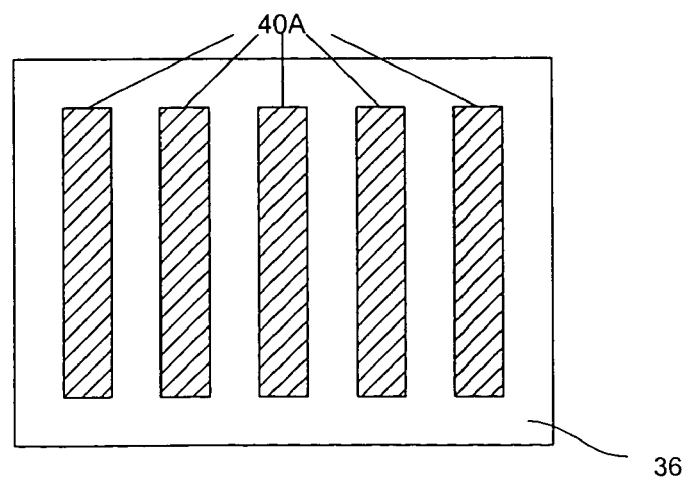
FIG. 5B is a top view of an exemplary process layer illustrating the gate channel formed.

The fabrication of semiconductors generally involves multiple processes whereby multiple layers of material are formed above a wafer body (or semiconducting substrate). Portions of those layers are selectively removed using known photolithography and etching techniques until such time as a completed device is formed. As discussed earlier, photolithography generally involves forming a patterned layer of photoresist material (positive or negative) above one or more layers of material that are desired to be patterned, and using the patterned photoresist layer as a mask in subsequent etching processes. For example, as shown in FIGS. 5A and 5B, a process layer 38 may be formed above a wafer 36 (or other previously-formed process layer), and a patterned layer of photoresist 40 is formed, as identified by the photoresist features 40A, above the process layer 36. By stating that the process layer 38 may be formed "above" the wafer 36, it should be understood that the process layer 38 may be formed on the wafer 36 as well as anywhere above one or more intervening layers.

In the context of the present invention, the process layer 38 is intended to be representative of any type of process layer that may be patterned in semiconductor fabrication operations. For example, the process layer 38 may be comprised of polysilicon, a metal, e.g., aluminum, or an insulating material having a dielectric constant less than 5.0, such as silicon dioxide, silicon oxynitride, etc. Further, the process layer 38 may be patterned or formed on a wafer 36 or over another process layer, e.g., a metal layer formed above a previously-formed layer of insulating material. Moreover, as will be clear to those skilled in the art, after a complete reading of this application, the present invention may be employed in a variety of situations encountered in semiconductor manufacturing. For example, the present invention may be employed in the context of forming gate electrode structures, conductive metal lines, openings in insulating layers, etc. Thus, the particular composition of the process layer 38 and the type of features formed in the process layer 38 should not be considered a limitation of the present invention unless such limitations are expressly set forth in the appended claims.

Figure 4:
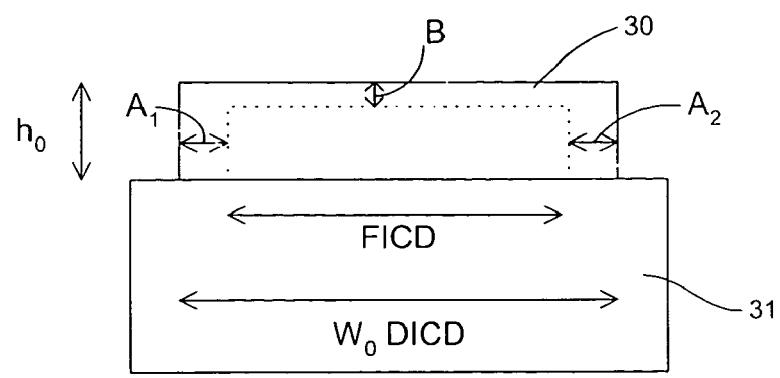
FIG. 4 is cross-sectional view of an exemplary semiconductor showing trim etch of the photoresist.

As shown in FIG. 4, trim etching of the resist 30 takes place in both the horizontal ($A_1, A_2$) and the vertical (B) directions. Thus, a resist line 30 which has an initial width of $w_0$ and an initial height of $h_0$ will be etched vertically at a resist vertical etch rate $R_v$, and horizontally at a horizontal resist etch rate $R_h$, which is the sum of the etch rates on the sides of the resist line 30. As discussed above, if the ratio $R_v/R_h$ is too low, resulting in a high aspect ratio, i.e., height/width ratio of the resist line, the resist can bend and/or collapse. In contrast, if the ratio $R_v/R_h$ is too high, the trim process may fail because insufficient resist is left to mask the remainder of the polysilicon etch process. In order to maximize the aspect ratio for manufacturing, sufficient photoresist must be provided for the etch process without compromising the photolithography process.

Figure 6A:
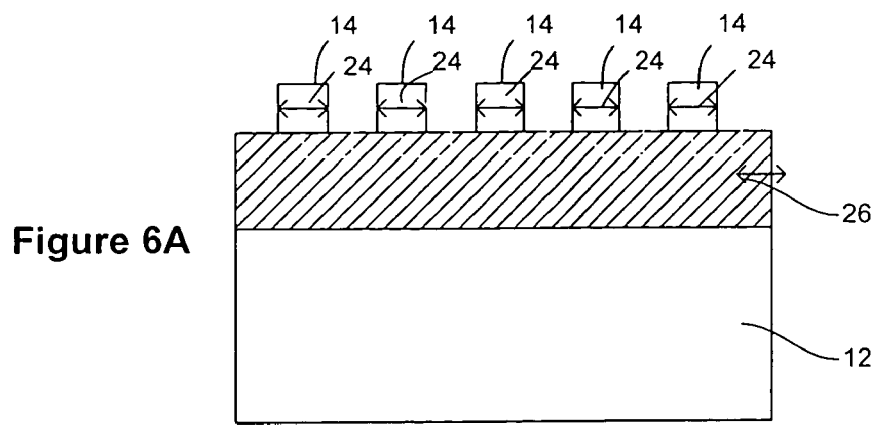
FIG. 6A is a cross-sectional view of an ideal field effect transistor.
Figure 6B:
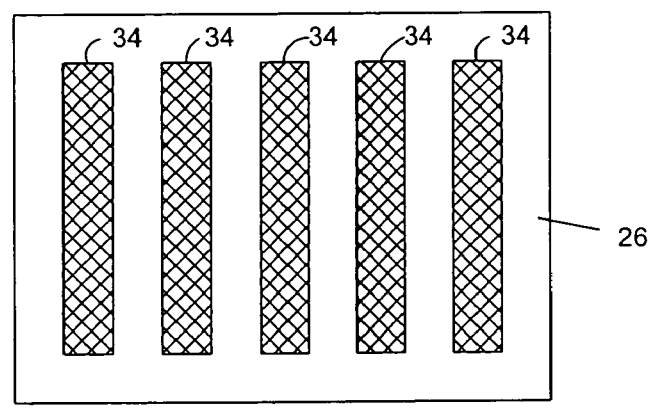
FIG. 6B is a top view of an ideal field effect transistor illustrating an ideal gate channel formed.
Figure 6C:
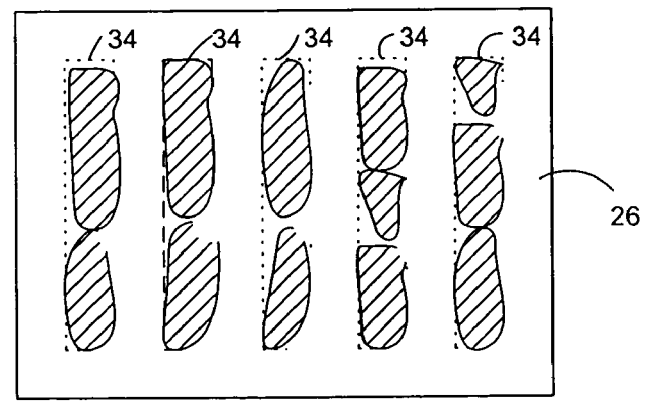
FIGS. 6C and 6D are top views of an ideal field effect transistor illustrating photoresist defects.
Figure 6D:
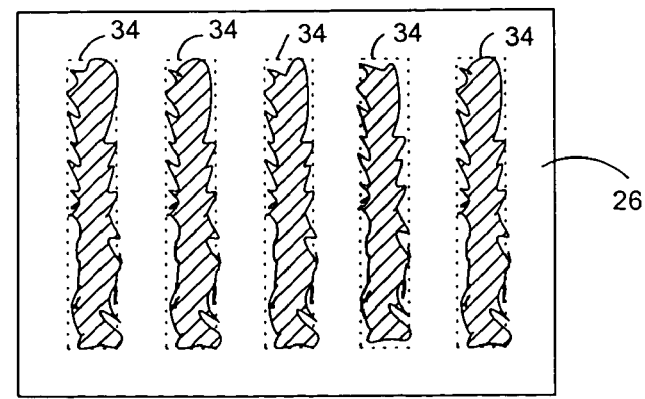

FIG. 6A illustrates a cross-sectional view of an ideal mask as applied. Various gate electrodes 14 are shown having corresponding channel lengths 24. FIG. 6B illustrates a top view of the ideal desired gate channel 34. FIG. 6C illustrates an incomplete gate channel formation due to insufficient resist or resist profile problems. Likewise, FIG. 6D illustrates incomplete gate channel formation due to resist bending and/or collapse during the etch process.

One embodiment of the present invention involves forming one or more grating structures 50 (see FIGS. 7A-7B) in the layer of photoresist 40 (depicted by dashed line) and determining the existence of a defect in the photoresist between the features comprising the grating structure 50. More particularly, the present invention provides a system and method for determining if a photoresist defect is present on the wafer based upon in situ scatterometric measurements. Moreover, in some embodiments, the results obtained using the present inventive methods may be used in controlling one or more parameters of subsequent photolithography operations to correct the discovered defect on the wafer where the defect was found and/or may also be used to form patterned layers of photoresist material on subsequently processed wafers.

Figure 7A:
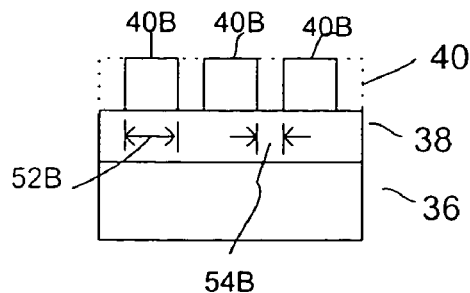
FIGS. 7A and 7B illustrate features of a grating structure compared to other photoresist features that may be formed in a layer of photoresist.
Figure 7B:
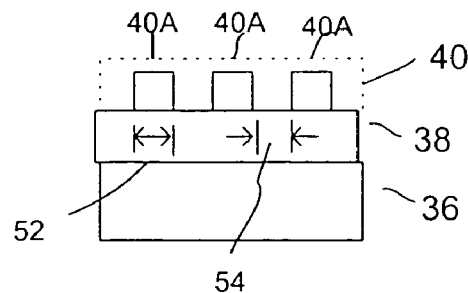
Figure 8A:
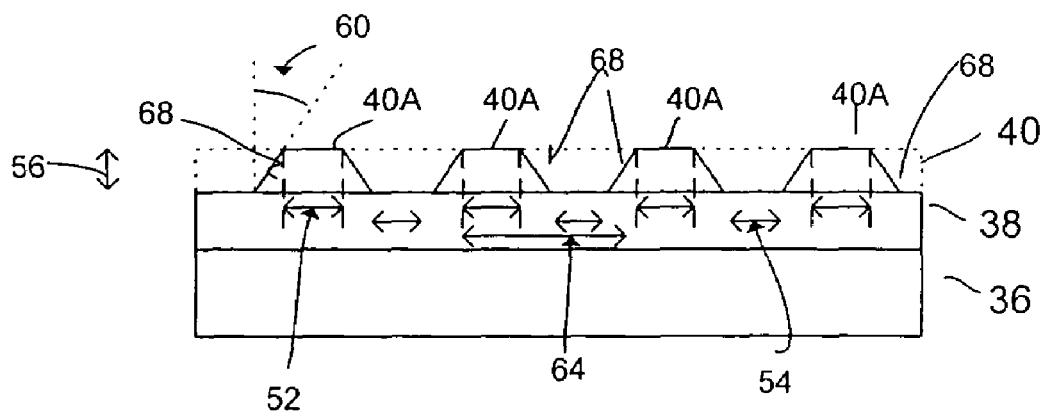
FIGS. 8A and 8B illustrate one exemplary embodiment of a grating structure that may be employed by the present invention.

The size, shape, and configuration of the grating structure 50 may be varied. For example, as shown in FIGS. 7B and 8A, the grating structure 50 may be comprised of a plurality of photoresist features 40A, e.g., multiple lines or trenches, formed in the layer of photoresist 40. The term "grating structure" as used herein is to be understood to refer to a grating structure comprised of a plurality of photoresist features 40A wherein the critical dimension 52 of the photoresist features 40A and/or the spacing (also known as pitch) 54 between the features 40A is less than the critical dimension 52B and/or spacing 54B of photoresist features 40B formed in the layer of photoresist 38 that are used in forming actual production features in the underlying process layer 36 in production devices, as shown in FIGS. 7A-7B. That is, the grating structure 50 is comprised of a plurality of photoresist features 40A that have a critical dimension 52 and/or a spacing (or pitch) 54 between the photoresist features 40A that are less than corresponding dimensions and/or spacing (or pitch) for photoresist features 40B used in forming working integrated circuit devices in the production die 66 of the wafer 36 shown on FIG. 9.

For example, as shown in FIGS. 7A-7B, in the case of forming a plurality of gate electrodes for production of integrated circuit devices, a plurality of photoresist features 40B having a critical dimension 52B of approximately 0.18 μm and a spacing 54B therebetween of approximately 0.72 μm may be formed above the process layer 38 comprised of polysilicon. In the same layer of photoresist 40, a grating structure 50 may be formed, and it may be comprised of a plurality of photoresist features 40A having a critical dimension 52 of approximately 0.14-0.16 μm and a spacing 54 therebetween of approximately 0.54 μm. Photoresist erosion or pattern collapse may be more readily detected in the grating structure 50 due to the fact that it is comprised of photoresist features 40B having a reduced feature size and/or reduced spacing between the photoresist features 40A. As a result, the present invention may be used to detect and indicate when problems are occurring in photolithography processes. Through use of the present invention, photoresist defects including photoresist erosion photoresist bending and pattern collapse, etc. may be detected and corrected prior to these problems affecting the production of photoresist features to be used in forming production devices.

Figure 8B:
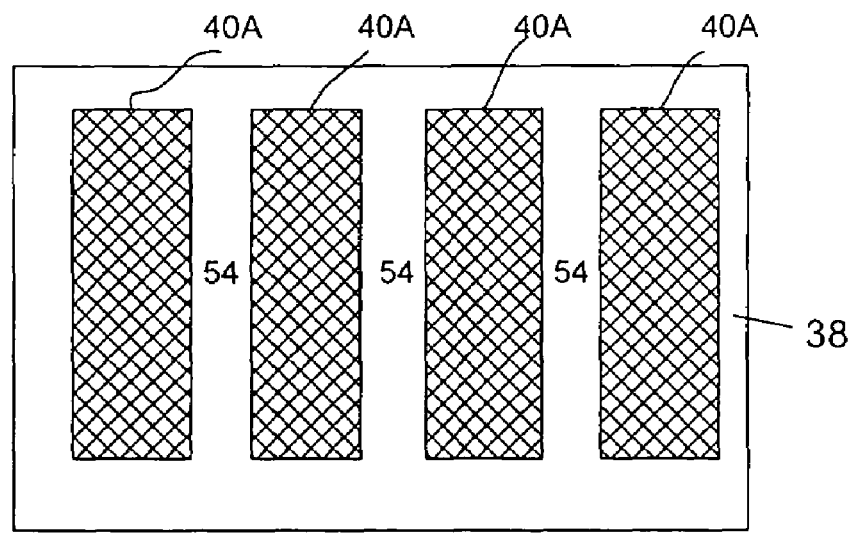

An illustrative grating structure 50, illustrated in FIGS. 8A and 8B, is comprised of a plurality of photoresist features 40A, e.g., lines, formed in the layer of photoresist 40. The photoresist features 40A comprising the grating structure 40 have a thickness 56 and sidewalls 68 disposed at an angle 60 (relative to a line normal to the surface 62 of the layer of photoresist 40). The thickness 56, the sidewall angle 60, and the pitch 64 of the photoresist features 40A may be varied as a matter of design choice. For example, the grating structure 50 may be formed in regions having approximate dimensions of 100 μm×120 μm, and it may be comprised of approximately 300-400 photoresist features 40A (depending upon the selected pitch). The thickness 56 of the photoresist features 40A will generally correspond to the thickness of the layer of photoresist 40. The sidewall angle 60 of the photoresist features 40A may vary as a matter of design choice.

The grating structure 50 may be formed as a separate test structure that is formed in the layer of photoresist 40 in an area defined by a scribe line of a wafer 36. The photoresist features 40A that are part of the grating structure 50 may be formed at the same time that other photoresist features, e.g., features 40B, are being formed for production devices formed on the wafer 36. That is, a pattern for the grating structure 50 may be formed in a reticle that will be used in the process of exposing the layer of photoresist 40 to form production integrated circuit devices within the die 66. Alternatively, a separate reticle may be used wherein only the grating structures 50 are formed in the layer of photoresist 40. This separate reticle may be used before or after the reticle used to expose the production devices is used.

Figure 9:
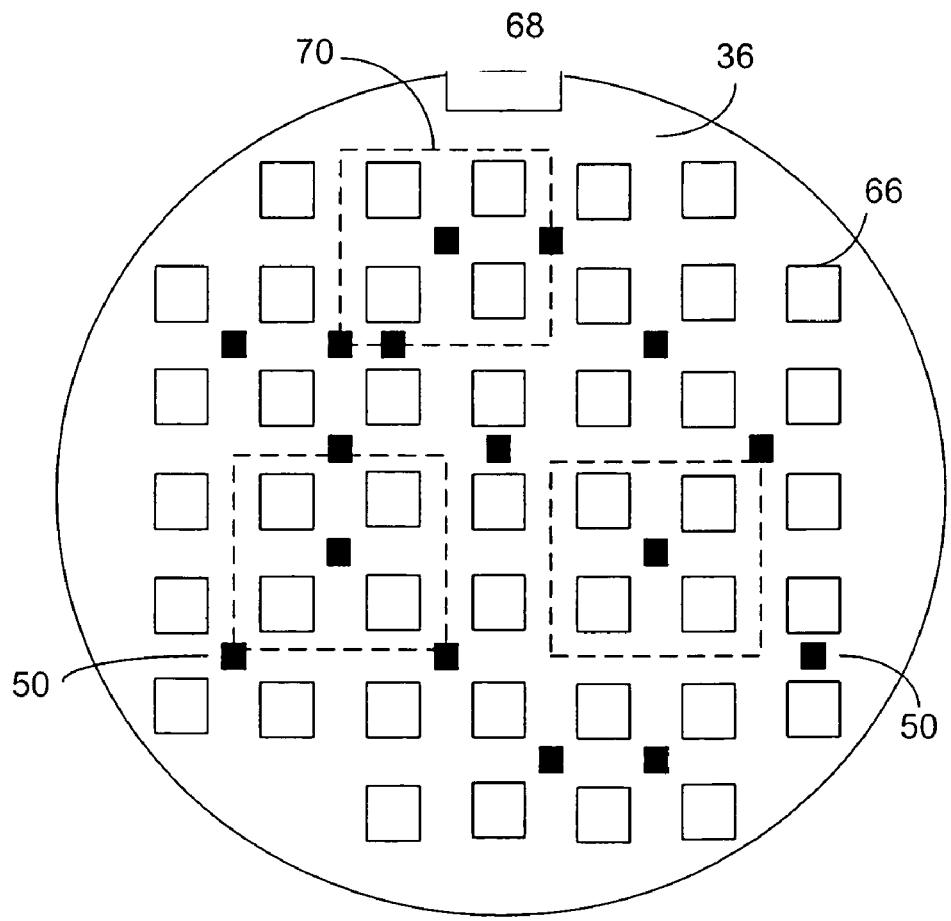
FIG. 9 is a plan view of an illustrative wafer depicting several production dies and grating structures.

As shown in FIG. 9, a plurality of production die 66 are formed above the wafer 36. The die 66 define an area of the wafer 69 where production integrated circuit devices, e.g., microprocessors, ASICs, memory devices, etc., will be formed. The size, shape and number of die 66 per wafer 36 depend upon the type of device under construction. For example, several hundred die 66 may be formed above an 8-inch diameter wafer 36. The wafer 36 may also have an alignment notch 68 that is used to provide relatively rough alignment of the wafer 36 prior to performing certain processes, e.g., an exposure process in a stepper tool.

A stepper tool contains a light source (not shown) that is used to project light through a reticle (not shown) onto the layer of photoresist 40. Ultimately, the image in the reticle will be transferred to the layer of photoresist 40, and the underlying process layer 38 will be patterned using the patterned layer of photoresist 40 as a mask during one or more subsequent etching processes. The exposure process performed on the wafer 36 is typically performed on a flash-by-flash basis as the wafer 36 is moved, or stepped, relative to the light source within the stepper tool. During each step, the light source projects light onto a given area of the wafer 36, i.e., each flash is projected onto an exposure field 70 (indicated by dashed lines). The size of the exposure field 70, as well as the number of die 66 within each exposure field 70, may vary greatly. For example, an illustrative exposure field 70 is depicted in FIG. 8 wherein four of the die 66 fall within the exposure field 70, i.e., a 2×2 pattern. However, the number of die 66 and size of the exposure field 70 may vary. For example, integrated circuits may be exposed using a 1×2 pattern (covering 2 die), a 5×5 pattern (covering 25 die), etc. The precise pattern of the exposure field 70 may be based upon the product under construction as well as the desires and judgment of the appropriate process engineer.

The grating structures 50 may be formed at the same time other photoresist features are being formed in the layer of photoresist 40 that will ultimately be used to define various features in the underlying process layer 38 in the area defined by the production die 66. Ultimately, these grating structures 50 will be measured using in situ scatterometric techniques, and these measurements may be used to determine the presence of photoresist defects including photoresist erosion, photoresist bending, pattern collapse, etc. during the plasma etch process or other photolithography processes.

In further embodiments, these measurements may be used to control one or more parameters of photolithography processes used to form a patterned layer of photoresist to troubleshoot a defective wafer or on a subsequently processed wafer. Normally, these grating structures 50 will be formed in the layer of photoresist 40 above the space between the die 66, i.e., in the area defined by scribe lines. The size of the scribe lines relative to the size of the die 66 in the attached figures is exaggerated for purposes of clarity. Alternatively, assuming there is available plot space, the grating structures 50 may be formed in the area defined by one or more of the die 66.

Figure 10:
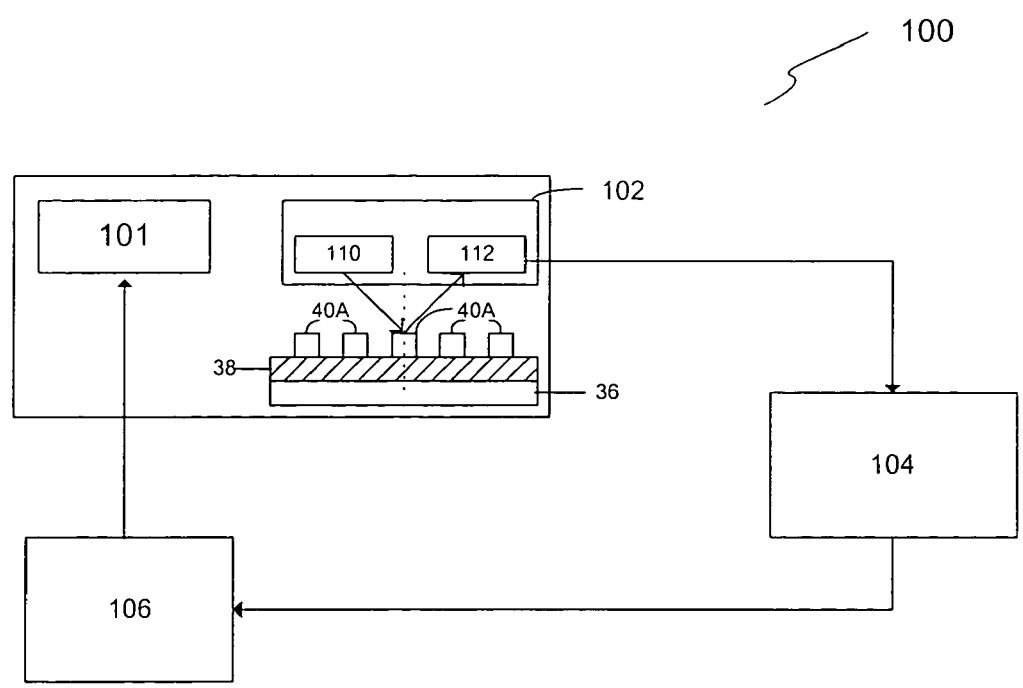
FIG. 10 depicts an illustrative embodiment of a system useful in practicing various embodiments of the present invention.

An exemplary system 100 that may be used to practice one or more aspects of the present invention is shown in FIG. 10. The system 100 is comprised of an etch chamber 114 that houses a photolithography tool 101 and a scatterometry tool 102. The system 100 further includes a computational tool 104 and a controller 106. The scatterometry tool 102 performs scatterometry measurements on a wafer 108. As shown in FIG. 10, the wafer 108 is positioned outside the scatterometry tool 102. One of ordinary skill in the art will readily appreciate that the wafer 108 may also be positioned within the scatterometry tool 102. Wafer 108 is representative of one or more wafers having a film stack comprised of at least one process layer 38 and a layer of photoresist 40 formed thereabove. The wafer 108 is depicted at the point in the photolithography process wherein the photoresist layer 40 has been deposited and developed resulting in photoresist features 40A.

The present invention is not limited to any particular step of the photolithography process. As shown in FIG. 10, the layer of photoresist 40 on the wafer 108 was subjected to an exposure process in the stepper tool to transfer the features defined in the reticle (not shown) to the layer of photoresist 40. During this process, at least one grating structure 50 was defined in the layer of photoresist 40, as were many other photoresist features that will be used to form production features in the underlying process layer 38. Ultimately, the layer of photoresist 40 will be subjected to a development process whereby soluble portions of the layer of photoresist 40 will be removed. This will result in the definition of a patterned layer of photoresist 40 that reflects the pattern in the reticle used during the exposure process. This patterned layer of photoresist 40 will be used in patterning the underlying process layer by performing one or more known etching processes.

A variety of scatterometry tools 102 may be used with the present invention, e.g., so-called 2Θ-type systems, lens-type scatterometry tools, etc. As shown in FIG. 10, the scatterometry tool 102 includes a light source 110 that may use white light, or some other wavelength or combination of wavelengths, depending on the specific implementation. Typically, the light source 110 will generate an incident beam that has a wide spectral composition and wherein the intensity of the light changes slowly in comparison to changes in wavelength. The angle of incidence of the light may also vary, depending on the specific implementation. The optical characteristic traces (also referred to herein as "target traces") generated by the scatterometry tool 102 may be based upon a comparison of light intensity to wavelength (for white light, fixed angle type scatterometry tools) or a comparison of intensity to incident angle (for angle resolved systems that use a single light source). Likewise, as discussed below, similar traces may be obtained for reflectance and phase depending on the detector used in the scatterometry system.

The scatterometry tool 102 further includes a detector 112. The detector 112 may be in the form of an ellipsometer or reflectometer. The detector 112 measures various parameters associated with the light diffracted from the surface of the wafer 108 (discussed below). In the case of an ellipsometer, the intensity and phase of the diffracted light is recorded as a function of wavelength. In the case of a reflectometer, the reflectance is measured. Additionally, the light source 110 and the detector 112 may be arranged in variety of ways, including in concentric circle configuration, with the light source 110 illuminating the wafer 108 from a perpendicular orientation, e.g., a reflectometer. Likewise, the intensity of the reflected light may be measured as s- and p-polarization over either multiple angles or at multiple wavelengths.

The scatterometry tool 102 also includes a data processing unit (not shown) loaded with a scatterometry software application for processing data collected by the optical hardware. The data processing unit may be implemented within the scatterometry tool 102 or the data processing unit may be implemented in the computational unit 104.

The computational unit 104 receives diffraction data from the detector 112. The computational unit 104 may be a computer or other electronic device. Based on the results on the diffraction data received, the computational unit 104 transmits a control signal to the controller 106. The controller 106 controls at least a portion of the controllable parameters associated with the photolithography tool 101 (e.g., the exposure dose of a stepper exposure process, the focus of the stepper exposure process, the duration of the subsequent development process, post exposure bake time and/or temperature, etc.).

Through use of scatterometry, an optical characteristic trace associated with an acceptable level of photoresist thickness or other characteristic may be obtained. These traces may be stored in a variety of manners, including a local cache, RAM, an electronic storage device or an electronic database or library of traces. The calculated scatterometry trace may be based on a variety of characteristics of the patterned photoresist mask (depicted as 40A in FIG. 10). In one aspect of the present invention, the optical characteristic trace may be based upon an acceptable thickness of the developed patterned photoresist mask. In another aspect of the present invention, the optical characteristic trace may be based upon detecting a defect in the pattern integrity associated with the patterned photoresist mask. In other aspects of the invention, the optical characteristic trace may be based upon the spacing between photoresist features 54, critical dimensions 52, or side wall angle 60 associated with of the photoresist features 40A (as shown in FIGS. 8A and 8B). Other characteristics or combinations of characteristics may also be used as the basis for obtaining the optical characteristic traces.

Variations in the amount of photoresist material and the associated profile degradations in the photoresist layer 40 will cause one or more of the optical characteristics to vary (e.g., varying thickness or a defect in the photoresist layer 40). In turn, this will cause a significant change in the diffraction characteristics of the incident light from the light source 110 of the scatterometry tool 102 (e.g., the intensity, phase, and/or reflectance will vary greatly from acceptable characteristic data. Thus, using Maxwell's equations, a unique optical characteristic trace may be established for a variety of anticipated situations reflecting desired photoresist characteristics. A series of traces corresponding to an acceptable thickness of photoresist may be calculated, measured and/or arrived at empirically and stored in a library or other retrievable manner. Through this technique, each trace in the library represents a characteristic of the patterned photoresist mask having a permissible variation of a specific characteristic (e.g., thickness or pattern integrity) associated with the patterned photoresist mask of the wafer 108.

A scatterometry measurement is made by the light source 110 emitting an incident light beam at an angle θ with respect to a normal to the surface of the wafer 108 as shown in FIG. 10. The light source 110 may be a laser, for example, or a broad spectral range source such as a lamp. Light is scattered from the surface of the wafer 108 and the scattering light scattered at an angle θ with respect to a normal to the surface of the wafer 108, is detected by detector 112. One of ordinary skill in the art will readily appreciate that during a scatterometry measurement, the angle θ (and correspondingly the angle −θ) may be scanned across a range of values. This may be accomplished, for example, by changing the relative position and/or orientation of the light source, light detector, and wafer 108. Alternatively, the angle θ may remain fixed and the light detector may provide an intensity for a range of light wavelengths.

The scatterometry data measured from the diffracted light may be dependent on the detector 112. For example, a scatterometry tool 102 employing a reflectometer will record reflectance as a function of wavelength. Likewise, a scatterometry tool 102 utilizing an ellipsometer will measure intensity and phase as a function of wavelength.

Upon performing a scatterometry measurement, the diffraction data is transmitted to the computational unit 104. In one aspect of the invention, the computational unit 104 provides a prediction of the thickness of the photoresist layer 40 by comparing the diffraction data with a diffraction data model, which is derived from the characteristic traces discussed above. The computational tool 104 compares the measured trace (i.e., individual or averaged) to a target or reference trace or a library of traces with acceptable degrees of pattern integrity to determine if the current measured trace falls within a suitable range. One of ordinary skill in the art will readily appreciate that there are any number of factors that may be used to base the range of target or reference traces or library of traces. For example, one such example is based upon the thickness of the patterned photoresist mask after development. Likewise, one of ordinary skill in the art should appreciate that the function of the computational tool 104 may also be accomplished by the scatterometry tool 102 (or some other computation tool resident within the manufacturing plant). When the comparison is performed, the scatterometry tool 102, computational tool 104, or controller 106 may then provide data as to the thickness of photoresist layer 40 to the photolithography tool 101.

Based upon this comparison, computational tool 104 transmits a control signal to the process controller 106. The control signal may direct the process controller 106 to take a variety steps. For example, if the comparison of the measured diffraction data with the data model of target or reference traces or library of traces indicates the presence of a defect, such as photoresist erosion, photoresist bending or pattern collapse, the photolithography process may be discontinued and the wafer 108 may be sent to be re-worked or re-patterned. By way of example, it may be the case that the light source (not shown) within the stepper has gradually degraded over time to the point that it no longer provides the same exposure dose, even though settings on the stepper tool indicate that it should. In this situation, the light source may be replaced prior to performing additional exposures processes on additional wafers. Likewise, if a defect in the photoresist is detected, the process controller may send the wafer 108 to be re-worked or re-patterned. This avoids scrapping of the entire wafer.

Additionally, based upon the determined thickness or pattern integrity associated with the patterned photoresist mask, the controller 106 may adjust one or more parameters of the photolithography tool 101 used to form a patterned layer of photoresist 40 (e.g., correct the detected problem, and repeat the photolithographic process on the given wafer or correct the detected problem on subsequently processed wafers). Furthermore, the results of the scatterometric measurement may be fed back to the controller 106. In turn, the controller 106 may modify or determine one or more process parameters for forming a patterned layer of photoresist above on the current or a subsequently processed wafer. Various parameters may be controlled using the present techniques, e.g., the exposure dose of a stepper exposure process, the focus of the stepper exposure process, the duration of the subsequent development process, post exposure bake time and/or temperature, etc. A variety of other parameters or combination of parameters may also be varied.

In another embodiment, the measured or generated trace of the grating structure 50 may be compared to a target trace selected from the library for a grating structure 50 comprised of photoresist features having a known, or at least acceptable, degree of photoresist erosion, photoresist bending or collapse. For example, a target trace may be calculated for a grating structure 50 comprised of photoresist features 40A having an ideal or acceptable degree of photoresist erosion, photoresist bending or pattern collapse using Maxwell's equations, and that target trace may be stored in a library or used as a reference. Thereafter, a measured trace of a grating structure 50 comprised of photoresist features 40A having an unknown degree of photoresist erosion, photoresist bending and/or pattern collapse is compared to the target trace. Based upon this comparison, it may be determined if the photolithography process is producing patterned layers of photoresist 40 that have acceptable characteristics. Using this technique, a determination may be made as to the acceptability of the patterned layer of photoresist 40, as well as the effectiveness of the photolithography process. Of course, this step may be performed in addition to the matching or correlating of a measured trace to a trace from the library as described above.

In the illustrated embodiments, the computational unit 104 and the process controller 106 are physically housed in a computer programmed with software to implement the functions described herein. However, one of ordinary skill in the art would readily appreciate that the operations performed by the computation unit 104 and process controller 106 may be implemented in hardware as well as software. Moreover, the operations performed by the process controller 106 may be performed by one or more controllers located throughout the system. For example, the controller 106 may be a fabrication level controller that is used to control processing operations throughout all or a portion of a semiconductor manufacturing facility. Alternatively, the controller 106 may be a lower level computer that controls only portions or cells of the manufacturing facility. Moreover, the controller 106 may be a stand-alone device, or it may reside as part of the photolithography system. However, as will be appreciated by those of ordinary skill in the art, a hardware controller (not shown) designed to implement the particular functions may also be used.

Figure 11:
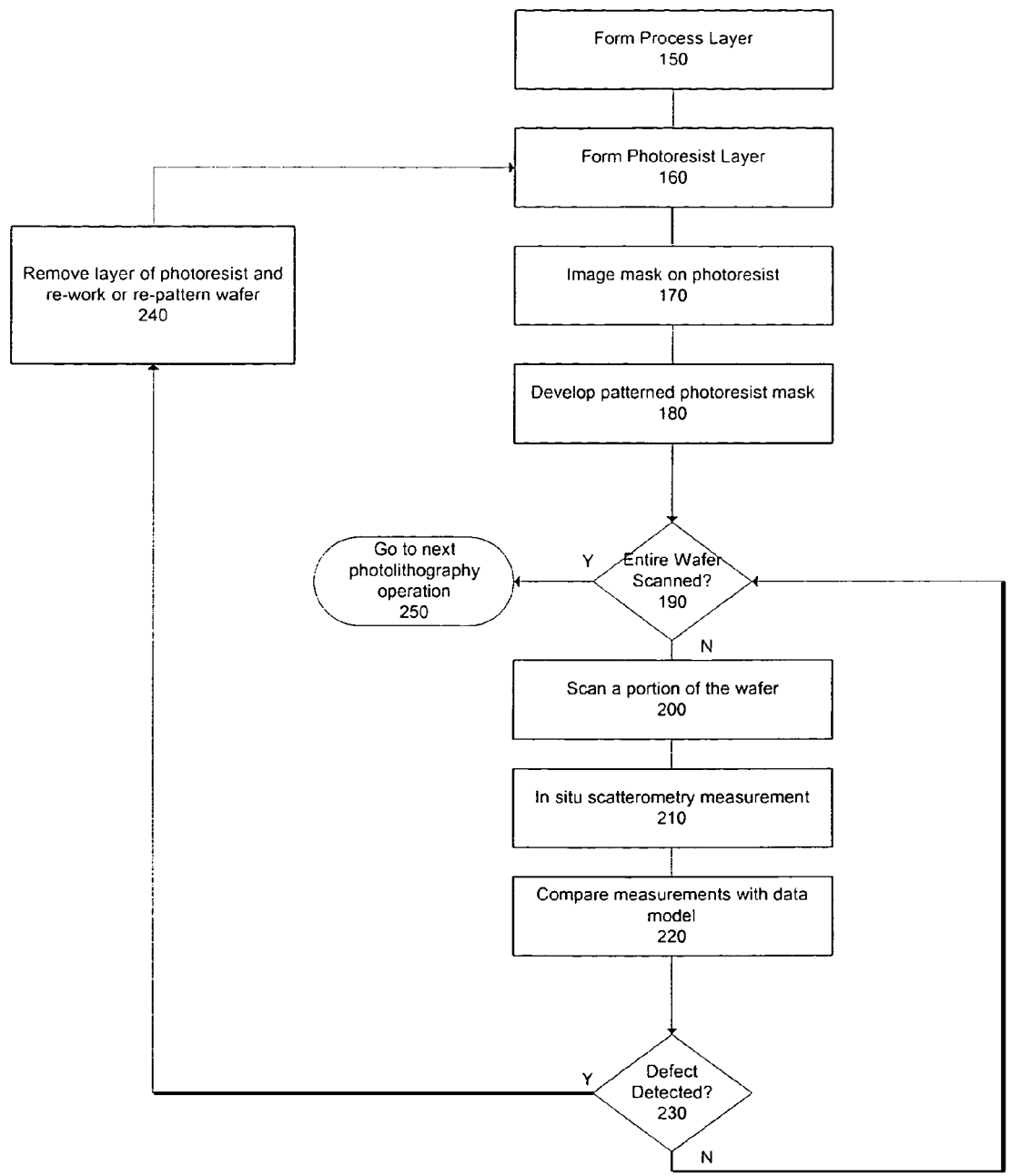
FIG. 11 is a block diagram illustrating a method in accordance with the present invention.

FIG. 11 illustrates a method in accordance with the present invention. A process layer is formed above a wafer, as depicted by block 150. A layer of photoresist is formed above process layer, as depicted by block 160. In block 170, a photomask is imaged and exposed on the layer of photoresist, the layer of photoresist is developed, as depicted on block 180. A section of the wafer is scanned and measured using in situ scatterometry, depicted by process blocks 200 and 210, respectively. The measured traces are then compared to target or reference traces or a library of traces, as depicted in process block 220. If a defect is detected, the wafer is sent for re-working or re-patterning, as depicted by process block 240. If no defect is detected, another section of the wafer is scanned and tested, as depicted by process block path 230, 190, 200, 210, and 220. This process continues until either a defect has been detected and the wafer is sent for re-working or re-patterning or the entire wafer has been scanned and no defect was detected.

As one of ordinary skill in the art will appreciate, the example system and method described herein can be modified. For example, certain steps can be omitted, certain steps can be carried out concurrently, and other steps can be added. Although particular embodiments of the invention have been described in detail, it is understood that the invention is not limited correspondingly in scope, but includes all changes, modifications and equivalents coming within the spirit and terms of the claims appended hereto.

What is claimed is:

1. A method for designing a grating structure for use in situ scatterometry, the method comprising:
    identifying a photoresist defect to be detected in a semiconductor;
    characterizing at least one photoresist feature associated with the semiconductor;
    designing at least one grating structure having at least one photoresist feature based upon a desired aspect ratio of the photoresist feature associated with the semiconductor;
    patterning a photoresist mask including the at least one grating structure to be imaged on a layer of photoresist.

2. The method of claim 1, wherein the photoresist defect includes at least one of photoresist erosion, photoresist bending, or pattern collapse.

3. The method of claim 1, further including modifying at least one parameter of a photolithography process used to form a patterned layer of photoresist on a wafer including modifying at least one of a stepper exposure dose, a stepper focus, or a duration of a photoresist development process based upon discovering the existence of the photoresist defect on the semiconductor.

4. The method of claim 3 further comprising modifying the at least one parameter of the photolithography process used to form a patterned layer of photoresist on at least one subsequently processed wafer based upon the determined presence of photoresist defect.

5. The method of claim 3 further comprising sending the wafer for re-work upon discovering the photoresist defect in the layer of photoresist.

6. The method of claim 3 further comprising sending the wafer for re-patterning upon discovering the defect in the layer of photoresist.

7. The method of claim 1, wherein the grating structure includes a plurality of photoresist features including a critical dimension and a pitch.

8. The method of claim 7, wherein the grating structure further includes a plurality of critical dimensions in the photoresist features.

9. The method of claim 7, wherein the grating structure further includes a variable pitch associated with the photoresist features.

10. A method for designing a grating structure for use in situ scatterometry, the method comprising:
    identifying a defect to be detected in a semiconductor;
    characterizing at least one photoresist feature associated with the semiconductor;
    designing at least one grating structure having at least one photoresist feature smaller than the photoresist feature characterized;
    patterning a photoresist mask including at least one grating structure to be imaged on a layer of photoresist.

11. The method of claim 10, wherein the photoresist defect includes at least one of photoresist erosion, photoresist bending, or pattern collapse.

12. The method of claim 10, further including modifying at least one parameter of a photolithography process used to form a patterned layer of photoresist on a wafer including modifying at least one of a stepper exposure dose, a stepper focus, or a duration of a photoresist development process based upon discovering the existence of the photoresist defect on the semiconductor.

13. The method of claim 12 further comprising modifying the at least one parameter of the photolithography process used to form a patterned layer of photoresist on at least one subsequently processed wafer based upon the determined presence of photoresist defect.

14. The method of claim 12 further comprising sending the wafer for re-work upon discovering the photoresist defect in the layer of photoresist.

15. The method of claim 12 further comprising sending the wafer for re-patterning upon discovering the defect in the layer of photoresist.

16. The method of claim 10, wherein the grating structure includes a plurality of photoresist features including a critical dimension and a pitch.

17. The method of claim 16, wherein the grating structure further includes a plurality of critical dimensions in the photoresist features.

18. The method of claim 16, wherein the grating structure further includes a variable pitch associated with the photoresist features.

19. A method for designing a grating structure for use in situ scatterometry, the method comprising:
    identifying a defect to be detected in a semiconductor;
    characterizing at least one photoresist feature associated with the semiconductor;
    designing at least one grating structure having at least one photoresist feature with substantially same dimensions as the photoresist feature characterized;
    patterning a photoresist mask including at least one grating structure to be imaged on a layer of photoresist.

20. The method of claim 19, wherein the photoresist defect includes at least one of photoresist erosion, photoresist bending, or pattern collapse.

21. The method of claim 19, further including modifying at least one parameter of a photolithography process used to form a patterned layer of photoresist on a wafer including modifying at least one of a stepper exposure dose, a stepper focus, or a duration of a photoresist development process based upon discovering the existence of the photoresist defect on the semiconductor.

22. The method of claim 21 further comprising modifying at least one parameter of the photolithography process used to form a patterned layer of photoresist on at least one subsequently processed wafer based upon the determined presence of photoresist defect.

23. The method of claim 21 further comprising sending the wafer for re-work upon discovering the photoresist defect in the layer of photoresist.

24. The method of claim 21 further comprising sending the wafer for re-patterning upon discovering the defect in the layer of photoresist.

25. The method of claim 19, wherein the grating structure includes a plurality of photoresist features including a critical dimension and a pitch.

26. The method of claim 25, wherein the grating structure further includes a plurality of critical dimensions in the photoresist features.

27. The method of claim 25, wherein the grating structure further includes a variable pitch associated with the photoresist features.

* * * * *